United States Patent [19]
Mikoshiba et al.

[11] Patent Number: 4,989,541
[45] Date of Patent: Feb. 5, 1991

[54] THIN FILM FORMING APPARATUS

[76] Inventors: Nobuo Mikoshiba, 30-18, Yagiyama-Honcho 2-chome; Kazuo Tsubouchi, 30-38, Hitokita 2-chome, both of Sendai-shi, Miyagi-ken, Japan

[21] Appl. No.: 479,941

[22] Filed: Feb. 14, 1990

[30] Foreign Application Priority Data

Feb. 23, 1989 [JP] Japan .................. 1-41891

[51] Int. Cl.$^5$ ............................. C23C 16/48
[52] U.S. Cl. .................. 118/723; 118/715; 118/725
[58] Field of Search .............. 118/715, 723, 725

[56] References Cited

U.S. PATENT DOCUMENTS

| | | | |
|---|---|---|---|
| 3,297,501 | 1/1967 | Reisman | 156/613 |
| 4,147,571 | 4/1979 | Stringfellow | 118/725 |
| 4,597,983 | 7/1986 | Kuhne | 427/27 |
| 4,645,687 | 2/1987 | Donnelly | 427/53.1 |
| 4,650,693 | 3/1987 | Kuisl | 427/27 |

FOREIGN PATENT DOCUMENTS

| | | | |
|---|---|---|---|
| 2397876 | 3/1979 | France . | |
| 52-2900 | 1/1977 | Japan . | |
| 53-54181 | 5/1978 | Japan | 118/715 |
| 60-36395 | 2/1985 | Japan . | |
| 61-143579 | 1/1986 | Japan | 118/723 |
| 61-181122 | 8/1986 | Japan | 118/715 |
| 61-194838 | 8/1986 | Japan | 118/715 |
| 62-158867 | 7/1987 | Japan | 118/715 |
| 63-318734 | 12/1988 | Japan | 118/715 |

OTHER PUBLICATIONS

Brodsky, IBM Tech. Dis. Bulletin, vol. 22, No. 8A, Jan. 1980.

Primary Examiner—Richard Bueker
Attorney, Agent, or Firm—Flynn, Thiel, Boutell & Tanis

[57] ABSTRACT

A thin film forming apparatus includes, in addition to a material gas nozzle, a control gas nozzle for jetting a control gas flow which encircles a material gas flow jetted from the material gas nozzle against a substrate supported in a reaction chamber, so as to shape the material gas flow into the form of a beam.

7 Claims, 5 Drawing Sheets

THIN FILM FORMING APPARATUS

FIELD OF THE INVENTION

This invention relates to a thin film forming apparatus, and more particularly to an improvement of such a thin film forming apparatus using a chemical vapor deposition.

BACKGROUND OF THE INVENTION

A thin layer forming apparatus using a chemical vapor deposition (abbreviated "CVD process") is known in the field of electronics as one of apparatuses for forming a thin layer on a substrate.

The CVD method, which is a composing method utilizing a chemical reaction, is appreciated to be a suitable method for forming a high quality thin film not easily damaged and having a good step-covering property as compared to a physical deposition process such as vacuum deposition and sputtering. Further, as compared to an MBE (molecular beam epitaxy) process requiring a high vacuum, the CVD process, not requiring such a high vacuum, can use an inexpensive apparatus and is therefore suitable for mass-production.

However, there still exist some problems to be solved to provide a higher quality thin film using the CVD process These problems are discussed below.

FIGS. 4 and 5 show gas flow patterns in a conventional thin film forming apparatus using the CVD process. In these drawings, reference numeral 1 refers to a reaction chamber, 2 to a nozzle for jetting material gas, 3 to a substrate, 4 to a heating susceptor for supporting and heating the substrate; 7 to a material gas flow from the nozzle 2.

FIG. 4 shows a pattern of the gas flow while the susceptor 4 is not heated and maintained at the ordinary room temperature (20° C.). The apparatus is designed so that the material gas flow appropriately reaches the substrate unless the susceptor is heated as referred to above. However, when the susceptor 4 is heated (400° C.) for promoting the chemical reaction, a turbulence occurs in the pattern of the material gas flow due to a heat convection. As a result, a desired supply is disabled, which causes deterioration in the quality of the deposited film such as disunimity of the film, generation of pin holes in the film caused by nuclei produced in the gas phase.

There is recently proposed a CVD apparatus of a reduced pressure system as an improvement to remove the drawback of the normal pressure reaction system referred to above. This relies upon its property of suppressing the heat convection to reduce the pressure of the reaction chamber and reduce the ascending force.

FIGS. 6 and 7 show forms of the material gas flow under a reduced pressure.

In FIG. 6 which shows the gas flow 7 while the susceptor 4 is not heated and maintained at the ordinary room temperature (20° C.), circulating vortexes already occur. This is caused by the fact that since the speed of the material gas flow from the nozzle 2 is faster than that under the ordinary pressure and the bounce from the susceptor is rather large. In FIG. 7 which shows the gas flow 7 while the susceptor is heated (1000° C.), there are produced such large vortexes that the gas having reached a vicinity of the substrate on the susceptor soar again due to an additional ascending force caused by the heat convection.

As referred to above, turbulences in the material flow are not completely removed by merely reducing the pressure of the interior of the reaction chamber. Therefore, mere use of a reduced-pressure reaction chamber in the CVD apparatus cannot suppress turbulences in the material gas flow, and cannot prevent deterioration of the film quality caused by gas flow turbulences.

Further, since pressure reduction causes the material gas flow to expand throughout the reaction chamber, the material gas pollutes the reaction vessel, and the reaction vessel, in turn, pollutes the material gas.

Under these circumstances, for purposes of forming a high quality thin film in a reduced-pressure reaction system, it is indispensable to provide a new method capable of controlling the gas flow so that the material gas does not contact the wall of the reaction chamber.

OBJECT OF THE INVENTION

It is therefore an object of the invention to provide a thin film forming apparatus wherein no turbulence in the material gas flow is produced in a reduced pressure reaction system and the material gas never contacts wall surfaces of a reaction chamber.

SUMMARY OF THE INVENTION

According to the invention, there is provided a thin film forming apparatus comprising:

a material gas nozzle for jetting thin film forming material gas against a substrate supported in a reaction chamber in order to form a thin film on said substrate; and a control gas nozzle disposed to encircle said material gas nozzle to jet a control gas flow for shaping a flow of said material gas from said material gas nozzle into the form of a beam.

In the thin film forming apparatus having the above-indicated arrangement, since the material gas flow jetted toward the substrate is shaped into a beam by another gas flow therearound, no turbulence caused by a heat convection occurs, and the material gas flow never contacts the wall surface of the reaction chamber.

BRIEF DESCRIPTION OF THE DRAWINGS

FIG. 1A is a view of an apparatus embodying the

DETAILED DESCRIPTION

Figure 1A:
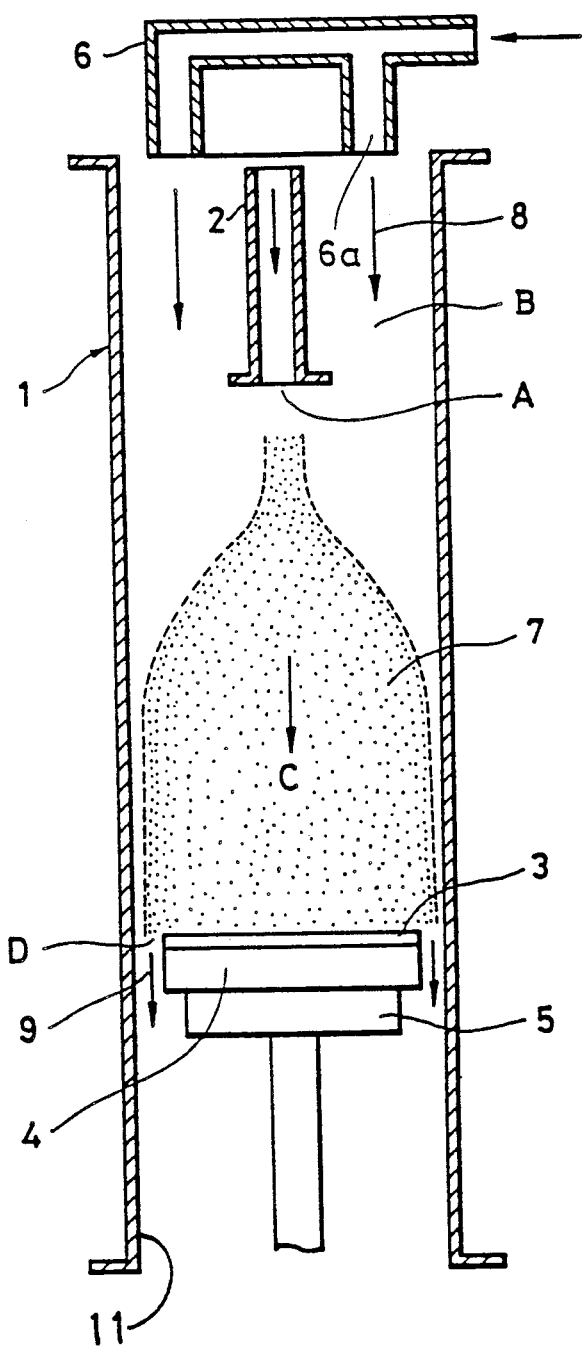
Figure 1B:
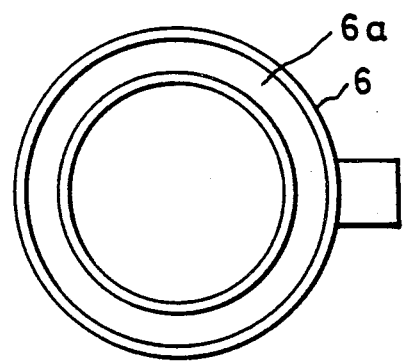
FIG. 1B is a plan view of a gas nozzle.

FIGS. 1A and 1B are views of a thin film forming apparatus embodying the invention, and identify the same or similar elements to those in FIGS. 4 to 7 by the same reference numerals.

That is, reference numeral 1 refers to a reaction chamber, 2 to a nozzle for jetting material gas, 3 to a substrate, 4 to a heating susceptor, and 5 to a susceptor supporting table. Around the nozzle 2 is disposed a control gas nozzle 6 for jetting control gas so as to encircle the material gas flow jetted from the nozzle 2.

Although details of the material gas supply system, discharge system and control gas supply system are not shown, known systems are used for them. The nozzle 6, as shown in FIG. 1B, has a ring-shaped gas jet opening 6a disposed substantially concentrically of the nozzle 2. As shown in FIG. 1A, the nozzle 6 has a diameter corresponding to the width of the susceptor 4, and it is disposed radially outwardly of the nozzle 2. The reaction chamber 1 has a discharge outlet 11 which opens below the susceptor 4 and has a diameter larger than the width of the susceptor 4.

The material gas flow 7 jetted from the nozzle 2 against the substrate 3 is surrounded by the gas flow 8 jetted from the control gas nozzle 6 and is shaped into a beam. From here on, the material gas flow 7 is called a source flow and the control gas flow 8 is called a sheath flow for a better understanding of the inventive system.

The gas which forms the source flow 7 is material gas for growth of a CVD thin film. It may be any gas including silicon-based material gas such as $SiH_4$, $Si_2H_6$, etc. in case of forming a silicon-based thin film, or may be any gas including III-family material gas such as TM, TMG, etc. or mixture gas of V-family material gas such as $A_5H_3$ and $NH_3$ the above-indicated V-family material gas in case of forming a III-V-family thin film In case of forming a II-VI-family thin film, the material gas may be any gas including II-family material gas or mixture gas including VI-family material gas. In other words, the material gas may be any gas including a specific material of the film to be deposited on the substrate.

Preferable gas for forming the sheath flow 8 is, for example, $H_2$ gas, $A_r$ gas or $N_2$ gas. In case of II-V and II-VI families, gas including V-family gas and gas including VI-family gas are acceptable, respectively In any case, the sheath flow 8 prevents a turbulence in the flow caused by a jumping-back of the source flow 7.

In order to realize the gas flow control for the purposes referred to above, the following conditions are required.

First of all, the flow amount of the sheath flow 8 must be larger than that of the source flow 7 It is preferred for the sheath flow amount to be as large as several decade times the source flow amount.

In a specific example using a reaction chamber of about 60 mm $\phi$, with displacement of 0.8 l/sec approximately under pressure of about 50 Torr, with the diameter of the susceptor being 54 mm $\phi$ approximately, the sheath flow was 3000 sccm and the source flow was 110 sccm.

In addition to the above-indicated requirement regarding the gas flow amounts, gas flow speeds in respective portion of the reaction chamber must be so established that the speed of the source flow at point A immediately after the jetting from the nozzle 2 is faster preferably by 1.5 to several times than the speed of the sheath flow at point B. The total flow speed at point C is substantially the same as that at point B. Further, it is necessary that the total flow speed passing through point D, i.e. a gap 9 defined between the reaction chamber and the susceptor, is much higher preferably by several to decade times than the flow speed at point C.

In a further specific example using the same reaction chamber of about 60 mm $\phi$ as referred to above, with displacement of 0.8 ;/sec approximately under pressure of about 50 Torr, with the diameter of the susceptor being 54 mm $\phi$ approximately, the source flow speed at point A was 12 cm/sec approximately, the sheath flow speed at point B 9 cm/sec, the total flow speed at point C 9 cm/sec approximately, and the total flow speed at point D in the gap 9 49 cm/sec approximately, respectively The pressure inside the reaction chamber may be varied as far as the source flow does not expand throughout the reaction chamber, it is sufficient to satisfy the relationship between the source flow amount and the sheath flow amount and the relationship between the flow speeds at points A, B, C and D.

According to the above-described gas flow control, no turbulence in the gas flow was produced even when the substrate is heated to about 1000° C. or more, and no contact of the material gas with the wall surface of the reaction chamber was recognized.

In particular, when the gap between the wall surface of the reaction chamber 1 and the susceptor 4 is narrowed to form the gap 9 as illustrated, the source flow of the material gas having reached the substrate surface is once expanded in a lateral direction, and subsequently speeded up at the position of the gap, so that it is swiftly sucked and evacuated into the gap. Therefore, the narrow gap 9 is effective in preventing a heat convection caused by the heat from the heated substrate.

Figure 1C:
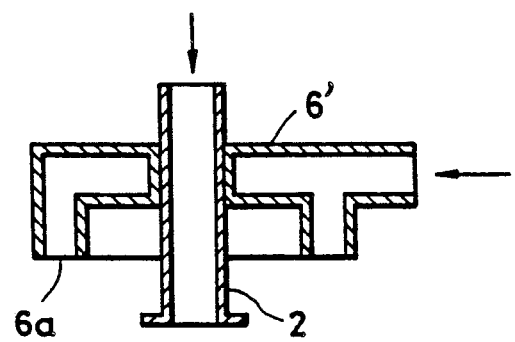
FIG. 1C is a cross-sectional view of a control gas nozzle and a material gas nozzle.
Figure 1D:
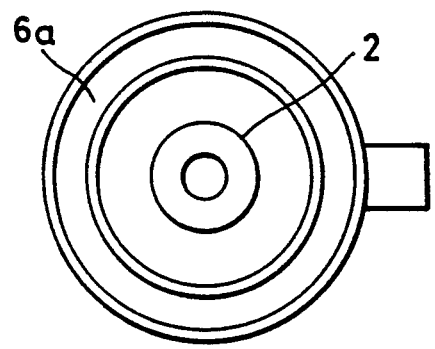
FIG. 1D is a plan view of the nozzle of FIG. 1C.

FIGS. 1C and 1D show a modification of the embodiment of FIGS. 1A and 1B in which the nozzle 2 substantially concentrically penetrates a nozzle 6'.

Figure 2:
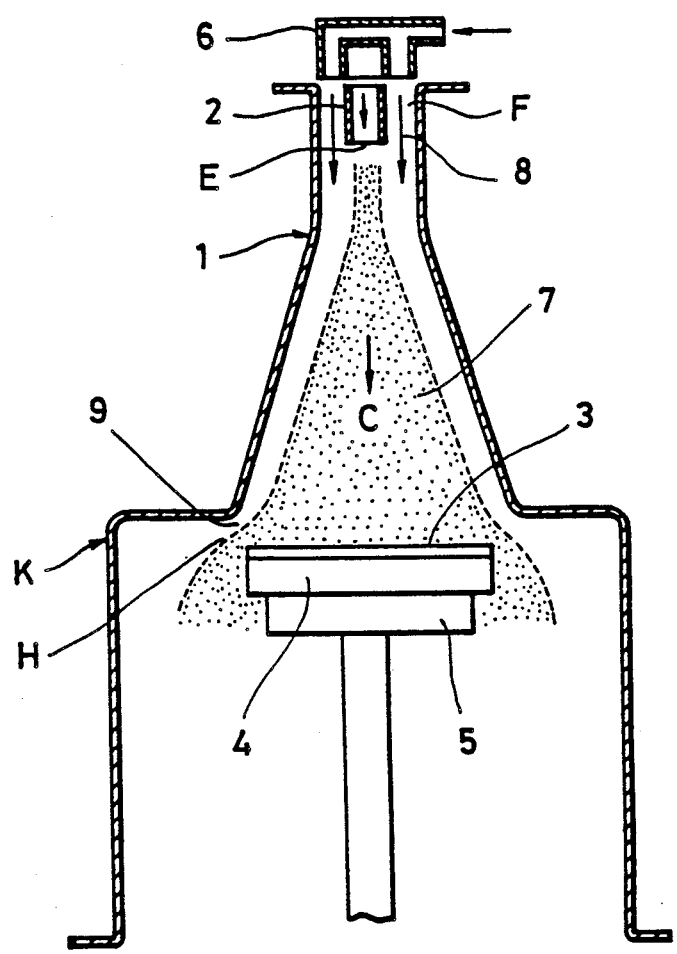
FIGS. 2 and 3 are views of further embodiments of the invention.

FIG. 2 shows a further embodiment using a conical reaction chamber 1. This embodiment also requires that the sheath flow amount is larger than the source flow amount as in the embodiments in FIGS. 1A to 1D. Further, regarding the flow speed at respective portions of the reaction chamber, it is necessary that the flow speed of the material gas jetted from the nozzle 2 is faster at point E than the speed of the sheath flow at point F.

In this embodiment, using the conical reaction chamber, the total flow at point G is set to be slower than the speed at point F. As a result, the flow pattern of the source flow 7 does not include the shoulder (laterally expanding portion) which is present in the flow pattern of the source flow 7 of the embodiments of FIGS. 1A to 1D, and is smoothly extended in the form of a beam onto the substrate surface Also in the embodiment of FIG. 2, the reaction chamber is spread out laterally above the substrate 3 in order to ensure better suppression of the heat convection above the substrate. Further, the position of the substrate 3 can be adjusted by the susceptor supporting table 5 to vary the width of the gap 9. Therefore, the total flow speed at point H in the gap 9 can readily be adjusted, so that the excessive value of the speed at point H with respect to the total flow speed at point G may be adjusted at any time in accordance with the substrate temperature so as to establish a sufficient, appropriate value to effectively prevent the heat convection.

In a specific example using a reaction chamber which has the diameter of about 20 mm $\phi$ at a portion I, the length of about 70 mm in the straight cylindrical portion above the portion I, the tapered length of about 80 mm in the conical portion, the diameter of about 40 mm $\phi$ at the bottom of the conical portion and the diameter of about 10 mm $\phi$ of the enlarged cylindrical portion K, with displacement of about 0.4 l/sec under reduced pressure of about 100 Torr, with the source flow amount of 110 sccm and the sheath flow amount of 3000 sccm, the gas beam shown by a dotted line is established. Even when the substrate is heated to about 1000°

C. or more, no turbulence was produced in the gas flow, and no contact of the material gas to the reaction chamber was recognized.

Figure 3:
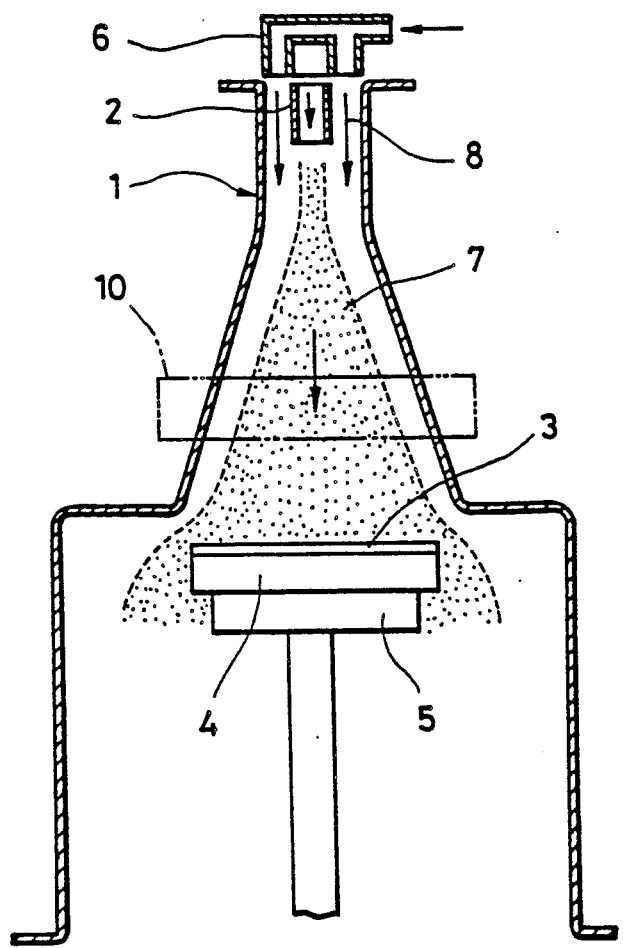
Figure 4:
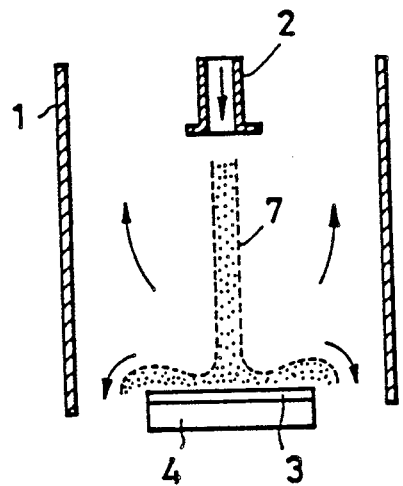
FIGS. 4 and 5 are views for showing gas flow patterns in a conventional ordinary-pressure thin film forming apparatus.
Figure 5:
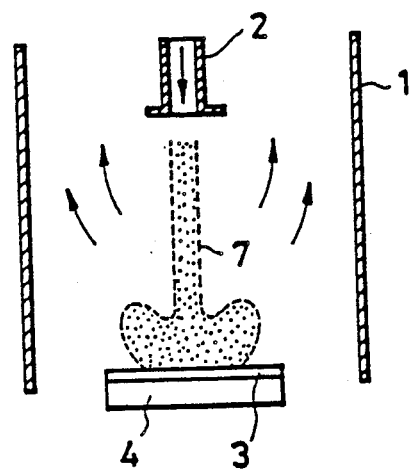
Figure 6:
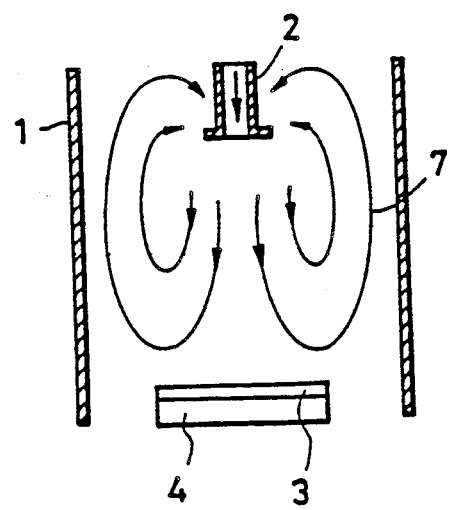
FIGS. 6 and 7 are views for showing gas flow patterns in a conventional reduced-pressure thin film forming apparatus.
Figure 7:
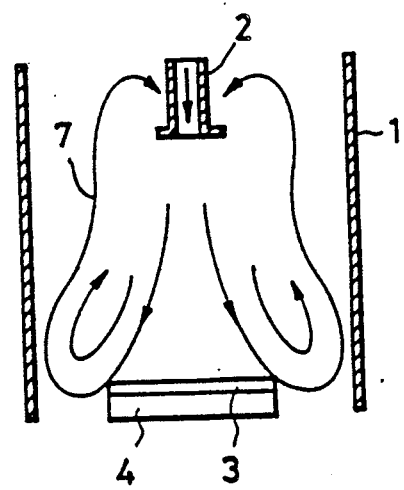

FIG. 3 shows a plasma CVD apparatus incorporating the invention. This is substantially the same as the embodiment of FIG. 2 except that a plasma exciting portion 10 is provided The plasma exciting portion 10 may use any selected one of high-frequency discharge, microwave discharge, ELR discharge, etc. Microwave discharge is preferable in pressure ranges where the source flow and the sheath flow can stably be formed.

When the gas flow is plasma-excited by the plasma discharge, pollution sources are generally increased by molecules, atoms, ions, electrons, active radicals, etc. in active gas which contact the wall surface of the reaction chamber. However, in the inventive arrangement configured to control the gas flow in the form of a beam, no turbulence occurs in the gas flow, and the material gas never contact the wall surface of the reaction chamber.

As described above, according to the inventive thin film forming apparatus, which effectively prevents a turbulence in the material gas flow and prevents contact between the material gas and the wall surface of the reaction chamber, ensures deposition of a high quality thin film.

What is claimed is:

1. A thin film forming apparatus of a pressure-reduced reaction type for forming a thin film on a substrate under a pressure reduced condition, comprising:
   a reaction chamber;
   substrate support means for supporting the substrate in said reaction chamber, said support means including a heating susceptor having an outer circumferential margin which is spaced by a gap from an inner wall surface of said reaction chamber;
   a material gas nozzle which is located directly above said substrate and ejects a material gas flow into said chamber toward said substrate perpendicular to an upwardly facing major surface of said substrate; and
   means for preventing said material gas flow from engaging walls of said chamber as it travels from said material gas nozzle to said substrate, including a control gas nozzle which is disposed above said substrate and encircles said material gas nozzle, said control gas nozzle ejecting into said chamber a control gas flow which encircles said material gas flow and which forcibly re-orients laterally expanding portions of said material gas flow in a direction toward said substrate;
   wherein said chamber has a gas outlet on an opposite side of said susceptor from said material gas nozzle, said outlet having a diameter larger than the width of said susceptor, wherein said material gas flow at the exit of said material gas nozzle has a speed faster than that of said control gas flow adjacent thereto, and wherein the total gas flow passing through said gap has a speed faster than a speed of the total gas flow above said substrate.

2. The thin film forming apparatus according to claim 1, wherein said control gas nozzle has a jet opening in the form of a ring which is substantially concentric to said material gas nozzle.

3. The thin film forming apparatus according to claim 2, wherein said control gas nozzle has an outside diameter which is approximately equal to an outside diameter of said susceptor.

4. The thin film forming apparatus according to claim 11, wherein said reaction chamber has between said nozzles and said susceptor a portion of tapered cross section which gradually diverges in the gas flow direction.

5. The thin film forming apparatus according to claim 4, wherein said reaction chamber includes a small-diameter portion having said nozzles therein, and a large-diameter portion having said susceptor therein, said portion of tapered cross section extending between said small-diameter and large-diameter portions.

6. The thin-film forming apparatus according to claim 5, wherein the position of said susceptor within said chamber is vertically adjustable.

7. The thin film forming apparatus according to claim 1, further comprising means for exciting by plasma one or both of said material gas and said control gas.

* * * * *

UNITED STATES PATENT AND TRADEMARK OFFICE
CERTIFICATE OF CORRECTION

PATENT NO. : 4 989 541

DATED : February 5, 1991

INVENTOR(S) : Nobuo MIKOSHIBA et al

It is certified that error appears in the above-identified patent and that said Letters Patent is hereby corrected as shown below:

Column 6, line 27; change "Claim 11" to ---Claim 1---.

Signed and Sealed this

Twenty-fourth Day of November, 1992

*Attest:*

DOUGLAS B. COMER

*Attesting Officer*     *Acting Commissioner of Patents and Trademarks*